United States Patent [19]

Losee et al.

[11] Patent Number: 5,256,891

[45] Date of Patent: Oct. 26, 1993

[54] CCD ELECTRODE STRUCTURE FOR IMAGE SENSORS

[75] Inventors: David L. Losee, Fairport; Eric G. Stevens, Rochester, both of N.Y.

[73] Assignee: Eastman Kodak Company, Rochester, N.Y.

[21] Appl. No.: 937,456

[22] Filed: Aug. 21, 1992

Related U.S. Application Data

[63] Continuation of Ser. No. 711,826, Jun. 7, 1991, abandoned.

[51] Int. Cl.[5] .................. H01L 29/78; H01L 27/14; H01L 31/00
[52] U.S. Cl. .................................. 257/233; 257/250; 257/659; 358/213.24
[58] Field of Search .................. 357/24 LR; 257/232, 257/233, 250, 659, 294, 435; 358/213.24

[56] References Cited

U.S. PATENT DOCUMENTS

| | | | |
|---|---|---|---|
| 4,772,565 | 9/1988 | Kamimura et al. | 437/4 |
| 4,774,586 | 9/1888 | Koike et al. | 357/24 LR |
| 4,908,684 | 3/1990 | Koike et al. | 357/24 LR |

FOREIGN PATENT DOCUMENTS 3-161973  7/1991  Japan ........................ 358/213.24

Primary Examiner—William Mintel
Assistant Examiner—Robert Limanek
Attorney, Agent, or Firm—Stephen C. Kaufman

[57] ABSTRACT

An image sensor including CCDs, a charge coupled device (CCD) or shift register. Each CCD structure is formed of a set of electrodes wherein at least one electrode of each set is formed of a connected layer of opaque conducting material.

4 Claims, 5 Drawing Sheets

CCD ELECTRODE STRUCTURE FOR IMAGE SENSORS

This a continuation of application Ser. No. 711,826 filed Jun. 7, 1991, now abandoned.

FIELD OF THE INVENTION

This invention relates to image sensors using CCDs.

BACKGROUND OF THE INVENTION

There are several types of image sensors using charge coupled devices (CCDs): linear, frame transfer and interline image sensors. In frame transfer image sensors, each pixel is composed of a set of two or more adjacent polysilicon electrodes. Polysilicon is a partially transparent material. In such devices, an aluminum light shield patterned with openings corresponding to selected electrodes may be provided. Light shines through the opening passing through the polysilicon electrode into the image sensor.

Frame transfer type devices require a means of shuttering in order to reduce extraneous signals during the read out time to an acceptable level. Such extraneous signals are commonly referred to as "image smear". In order to avoid the need for mechanical shuttering and to reduce image smear interline transfer type CCD image sensors have been developed.

In interline transfer imaging devices, photogenerated charge is collected at photodiode sites (or pixels) on pn junctions or under the gates of photocapacitors, for a period of time and then transferred into adjacent charge coupled registers to be detected by an output circuit. In an area array of such photocharge collection sites it is necessary to transfer the collected photocharge, first to a vertical CCD shift register and then to a horizontal CCD shift register, finally, reaching a charge sensitive detector or amplifier.

Typically, a light shielding material is provided over the vertical and horizontal shift registers in order to prevent the still incident light from producing smear signals during the time for read out of the device. In this way, the need for a mechanical shutter is eliminated and the photocharge collection sites may continue to collect charges to be read out subsequently.

In prior art, such as disclosed in Oda, U.S. Pat. No. 4,772,565, for example, and indicated schematically in FIGS. 1 and 2, a given row of pixels 10 is addressed by application of a voltage to electrodes 20 and 30, composed respectively of first and second levels polycrystalline silicon (poly-1 and poly-2) and, which are both connected to the same vertical clock, $\Phi_1$. Upon application of a voltage, photocharge is transferred to a buried channel 40 of the vertical shift register. Electrical isolation between photodiodes and the vertical shift register is provided by a channel stop region 15, also indicated in FIG. 1. As shown in FIG. 2, this vertical shift register is composed of buried channel 40, overlapping electrodes 20 and 30 which are connected to vertical clock $\Phi_1$, and overlapping poly-1 and poly-2 electrodes 50 and 60 which are connected to vertical clock $\Phi_2$. These electrodes are separated from the substrate semiconductor 70 by an insulating layer 80. The regions 65 beneath electrodes 30 and 60 are ion implanted to provide a potential energy difference between regions 25 and 26, controlled by the $\Phi_1$ clock, and between regions 55 and 56, controlled by the $\Phi_2$ clock.

Because the polysilicon electrodes are transparent to light, an additional layer of light shielding material must be provided to prevent extraneous photoinduced charges from interfering with the image charges during the charge read-out via the CCD shift registers. To provide such a light shield, an insulating layer is provided over the polysilicon electrodes and an opaque layer such as aluminum is deposited onto the insulating layer. This opaque layer is patterned with openings corresponding to the photodiodes but covers the polysilicon electrodes in the vertical CCD shift register. This added light shielding layer adds topographic variation to the device and provides additional opportunity for short circuits to the polysilicon gate electrodes, for example, through pinholes in the insulating layers beneath the aluminum layer.

SUMMARY OF THE INVENTION

It is an object of this invention to eliminate the need for a separate light shield.

This object is achieved in an image sensor with CCD shift registers having sets of electrodes, the improvement comprising at least one electrode of each set being formed from a layer of opaque conducting material.

Advantages of this invention are that the function of one clock phase and the lightshield are combined, thus simplifying the manufacture of the device and providing a degree of "self-alignment" of the light shield to the photodiode structures.

MODES OF CARRYING OUT THE INVENTION

Figure 1:
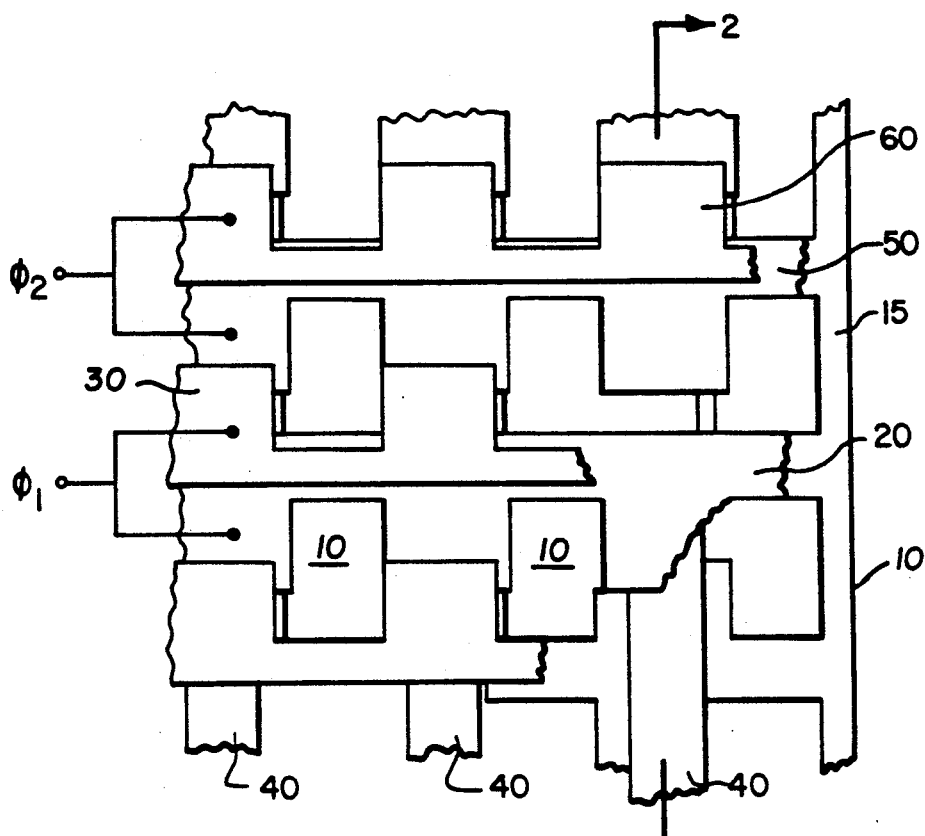
FIG. 1 is a plan view of a typical prior art imaging device.
Figure 2:
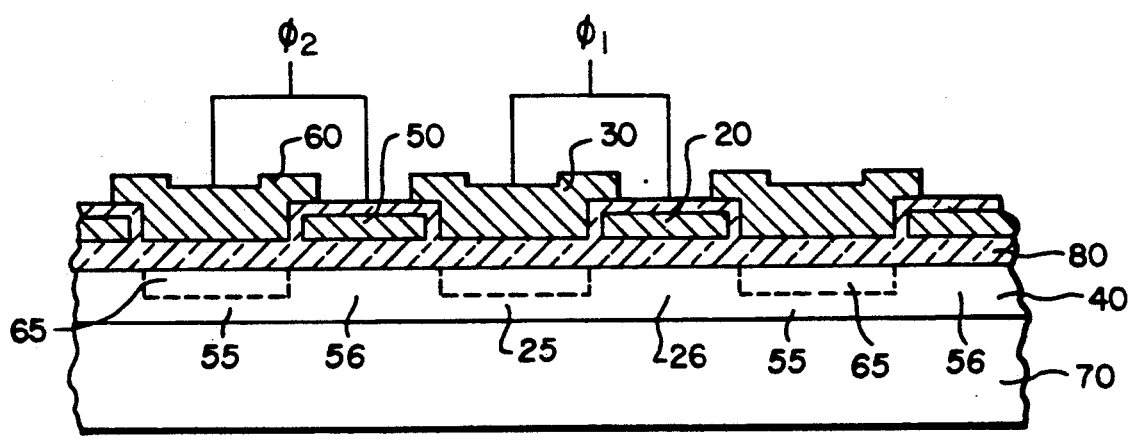
FIG. 2 is a fragmentary, partially schematic vertical section view through a semiconductor device, taken along the lines 2—2 of FIG. 1 further illustrating the prior art construction.

This invention is disclosed with specific reference to an interline image sensor using a "true two-phase structure" wherein each clocked phase of the CCD is composed of a single electrode. In this disclosure, the term "true two-phase" CCD refers to a CCD wherein regions exist in the silicon beneath each gate electrode to serve as barrier regions and storage regions. Furthermore, each gate electrode is composed of a single conducting layer or composite layer. Implanted barrier and storage regions suitable for such devices may be constructed by known methods, such as disclosed by Losee et al., U.S. Pat. No. 4,613,402 or Rhodes, U.S. Pat. No. 4,742,016. In the present invention, the second level electrode is composed of an opaque continuous layer which thus provides a lightshielding function in addition to a clocking function. This invention is particularly suitable for use in true two-phase devices since there does not need to be an etched separation between the second (upper) level electrodes at each CCD stage as required by prior art devices such as disclosed by Oda, U.S. Pat. No. 4,521,797, and illustrated schematically in the cross-sectional drawing FIG. 2, or by Kobayashi et al., U.S. Pat. No. 4,829,368. In these prior art devices, the second level of polysilicon has separate regions connected to separate vertical CCD clock voltages. Without an etched separation of these regions short circuits would exist between the vertical CCD clocks. Thus, in this invention, the second level electrode may be continuous, or at least connected in a topological sense, and may be formed out of any of a variety of opaque conducting materials. Apertures are etched in this layer to provide photo-collection sites such as photodiodes.

Figure 3A:
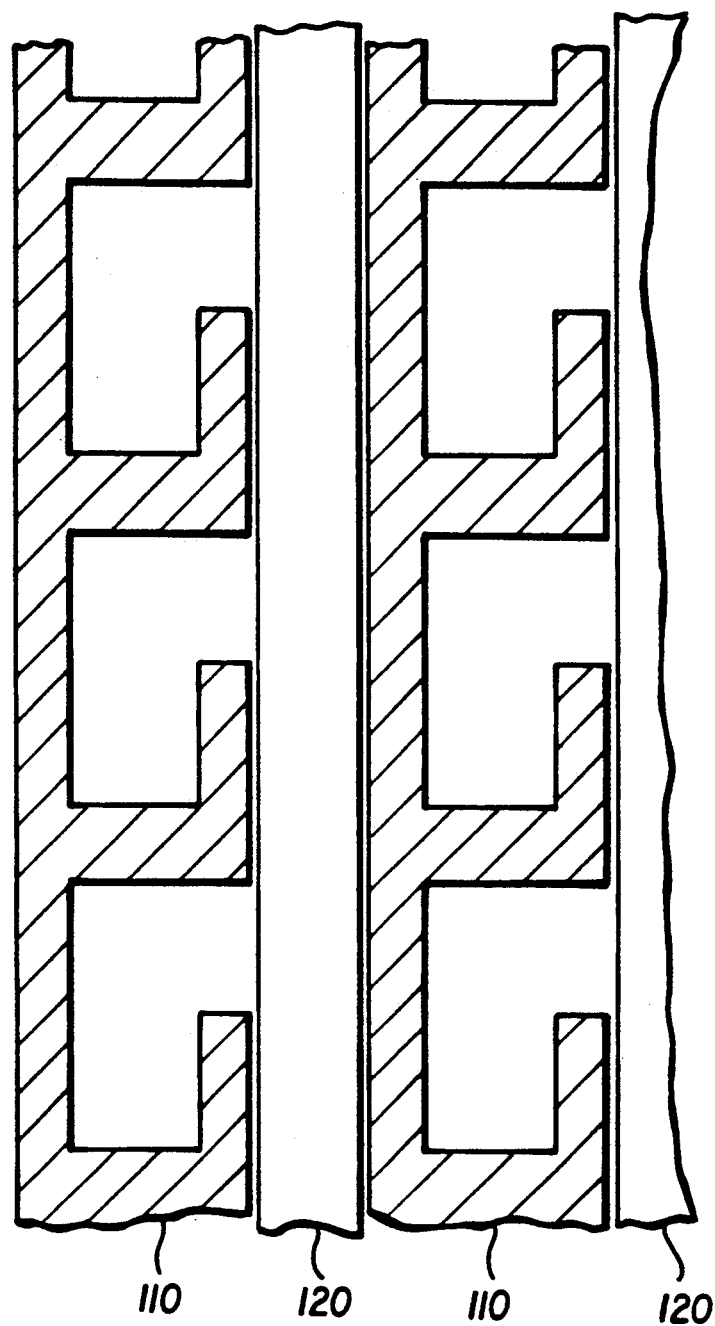
FIGS. 3a-3c are plan views illustrating various stages in the construction of an embodiment of the present invention.
Figure 3B:
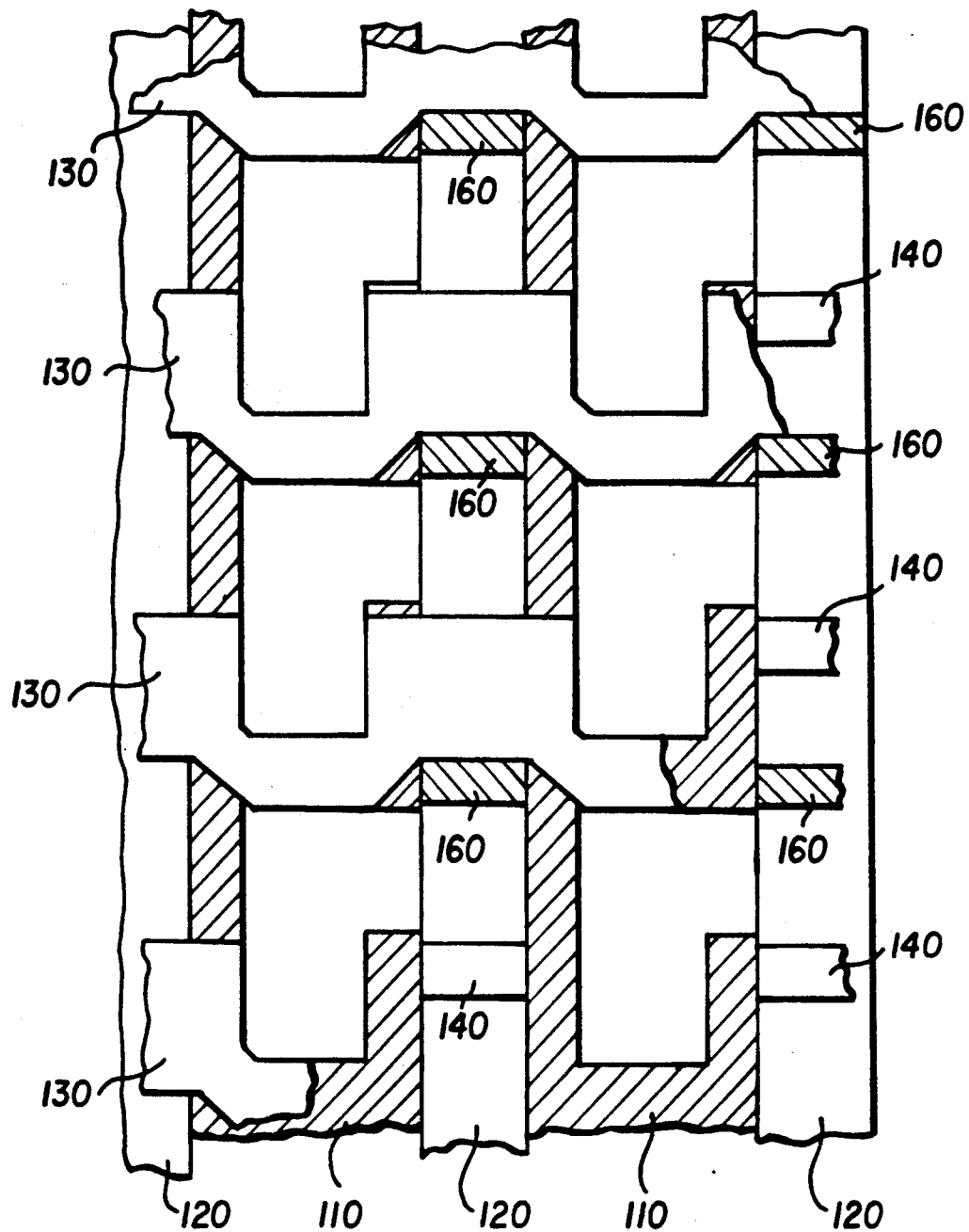
Figure 3C:
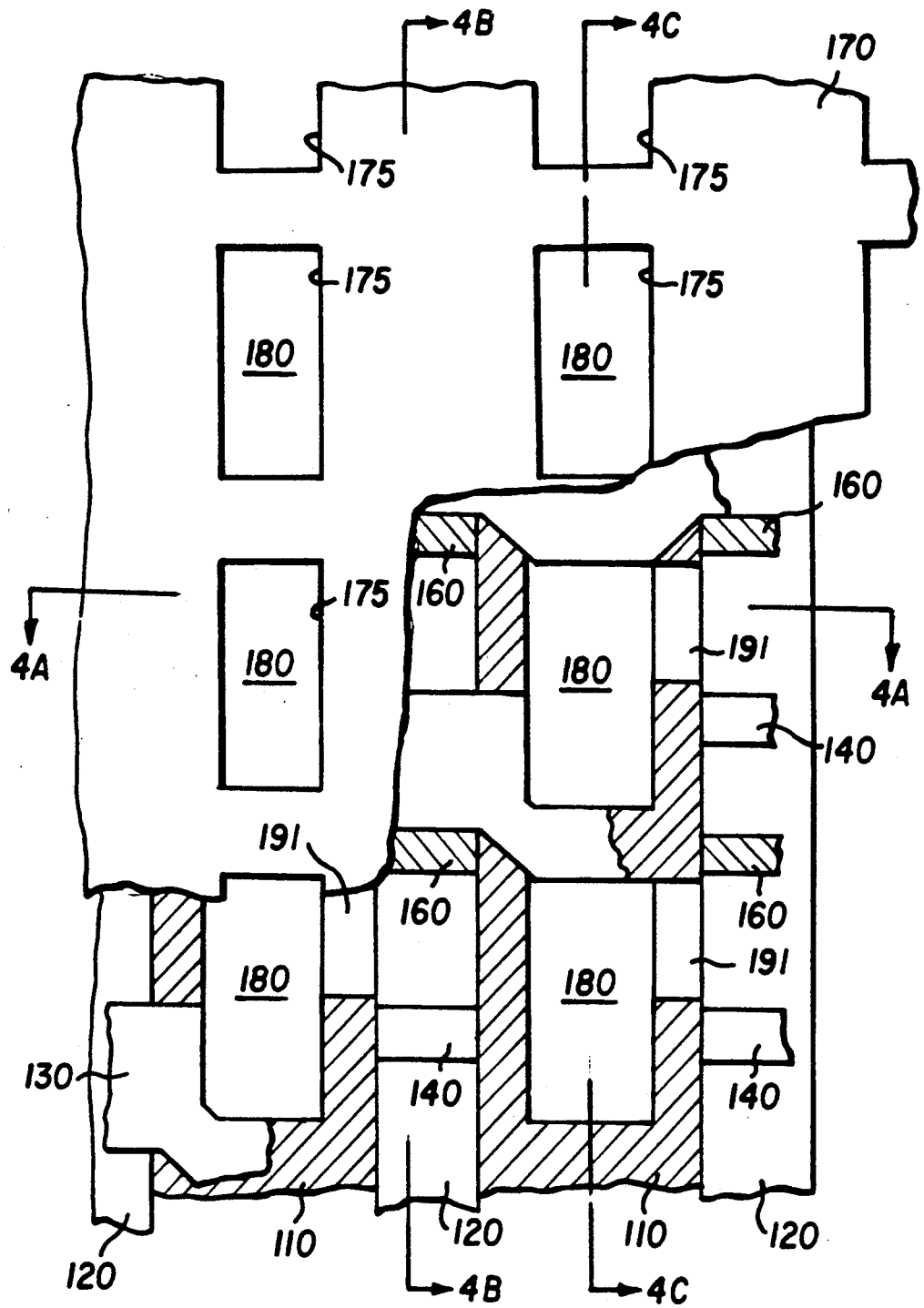
Figure 4A:
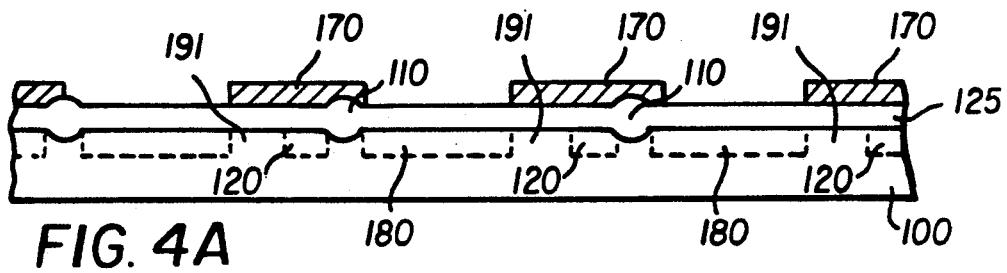
FIGS. 4a-4c are fragmentary, partially schematic cross-sectional views taken along the lines 4A—4A, 4B—4B, and 4C—4C of FIG. 3c, respectfully.
Figure 4B:
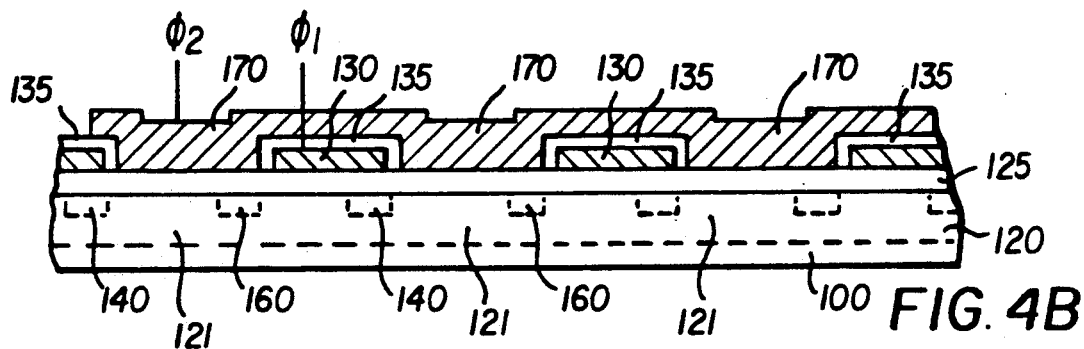
Figure 4C:
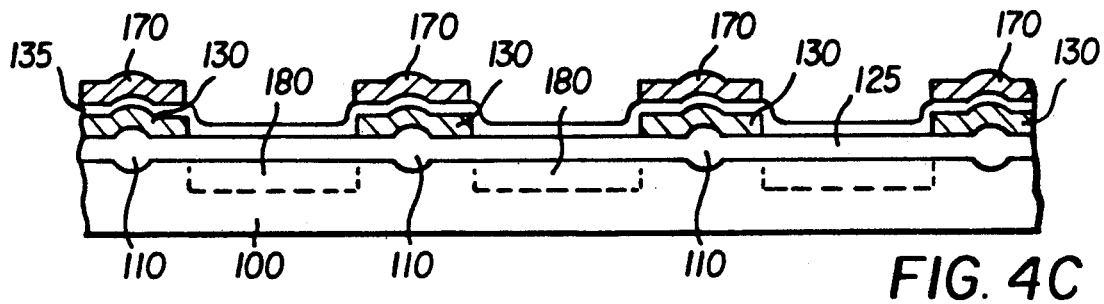

With reference to FIGS. 3a-c and 4a-c, a semiconductor substrate 100 is provided with channel stop regions 110 and buried channel regions 120 as shown in plan view in FIG. 3a. As shown in FIG. 3b and FIG. 4b, an insulating oxide 125 is grown over the semiconductor surface and a single layer or level of polysilicon 130 is deposited and patterned. Barrier regions are provided in regions 140 by methods such as described by Losee et al in U.S. Pat. No. 4,613,402. The barrier regions 140 are provided under edges of electrodes 130. A barrier region 160 is also provided by ion implantation of an appropriate dopant adjacent to an opposite edge of layer 130. Turning now to FIG. 3c and FIG. 4c, an insulating layer of oxide is then grown over the polysilicon conductor 130 and barrier region 160. An opaque layer of conductor is deposited and patterned to form electrode 170. In FIG. 3c we see the electrode 170 as a continuous sheet of opaque conductive material with aperture holes 175. Patterning of the apertures 175 in layer 170 is carried out using standard photolithographic and etching processes as are well known to those skilled in the art.

Ion implantation of appropriate dopants through aperture holes 175 then allows the formation of photodiodes 180. With suitable choice of dopant implantation energy, the layer 170 will serve to block implantation into areas other than openings 175, thus providing a self-alignment of the photodiode 180 with an edge of the opaque electrode 170. Region 191, the space bounded by photodiode on one side, buried channel 120 on the opposite side and channel stop 110 on the other sides, covered by gate oxide 125 and electrode 170, form a surface channel MOS transistor transfer gate for allowing photocharge in photodiode 180 to be collected and subsequently transferred to buried channel 120 for read out. Self alignment of photodiode 180 with the edge of electrode 170 facilitates the manufacturability of the device by reducing the likelihood of extraneous potential wells or barriers between the photodiode 180 and the transfer gate region 191.

Electrodes 130, connected to a first phase clock and electrode 170, connected to a second phase clock, together with buried channel 120 and barrier regions 140 and 160, form the vertical CCD shift register.

In operation, light incident on the device is absorbed in photodiode regions 180 and photocharge so generated collects in region 180. Light is shielded from other areas of the device by opaque electrode 170, and, in particular, is prevented from reaching the buried channel 120 of the CCD shift register.

It is evident that a number of suitable materials exist for formation of electrode 170. Examples of such materials are: aluminum, aluminum alloys, refractory metals such as molybdenum, tungsten, or metal silicides such as MoSix, WSix, etc. or composite layers of the above materials in combination with polysilicon.

In operation, the channel potentials under electrodes 130 are controlled by clock $\Phi_1$ and are shielded from electrode 170 and clock $\Phi_2$ by virtue of the conductivity of electrode 130.

Operation of the device is as follows. Light incident on the photosites 180 is absorbed and generates electron-hole pairs. The photogenerated electrons are collected by the electric fields surrounding sites 180. At the end of a period of time, a positive voltage is applied to electrode 170. The photocharge from region 180 is transferred to the storage region under said electrode, region 121 of FIG. 4b in this case. Electrodes 130 and 170 are then clocked to sequentially transfer photocharges from all such photosites 180 to charge detection circuitry. It is, of course, understood that the above description is that of an n-channel device. An analogous description of a p-channel device could be made wherein voltages are of reversed polarity and photogenerated holes are collected and transferred.

The invention has been described in detail with particular reference to a certain preferred interline image sensor, but it will be understood that variations and modifications can be effected within the spirit and scope of the invention. For example, those skilled in the art will appreciate how the present inventions can also be employed in linear image sensors.

We claim:

1. An interline transfer type area image sensor comprising:
   a plurality of photocollection sites arranged in an array of rows and columns, each of the photocollection sites being capable of collecting charge therein;
   a separate CCD extending along each column of the photocollection sites and adapted to receive therein the charge from the photocollection sites in the adjacent column, each of the CCDs comprising:
   a series of sets of electrodes with at least one set of the electrodes being formed of a single continuous layer of an opaque conducting material extending over all of all the CCDs; and
   one voltage clock connected to the one set of the electrodes and a separate voltage clock connected to the other sets of electrodes.

2. The image sensor of claim 1 wherein each CCD is a two-phase device and the opaque electrode overlies an adjacent electrode.

3. The image sensor of claim 2, wherein the connected layer of opaque material is patterned with apertures to admit light to a photocollection site.

4. The image sensor of claim 3 wherein the opaque conducting material is formed as a layer of doped polysilicon which is overlaid with a refractory metal silicide.

* * * * *